United States Patent [19]

Yoshino et al.

[11] Patent Number: 4,546,409
[45] Date of Patent: Oct. 8, 1985

[54] DEVICE FOR COOLING SEMICONDUCTOR ELEMENTS

[75] Inventors: Souichi Yoshino, Himeji; Tadashi Kusanagi, Kobe; Masakazu Mori, Himeji, all of Japan

[73] Assignee: Mitsubishi Denki Kabushiki Kaisha, Tokyo, Japan

[21] Appl. No.: 479,073

[22] Filed: Mar. 25, 1983

[30] Foreign Application Priority Data

| Apr. 2, 1982 [JP] | Japan | 57-56249 |
| Apr. 2, 1982 [JP] | Japan | 57-56250 |
| Apr. 2, 1982 [JP] | Japan | 57-56251 |
| Apr. 2, 1982 [JP] | Japan | 57-56252 |

[51] Int. Cl.⁴ .................. H01L 25/12; H05K 7/20
[52] U.S. Cl. .................. 361/387; 357/81; 361/386; 228/110
[58] Field of Search .......... 357/81, 74; 361/386, 361/387, 388, 389; 228/110, 111, 123

[56] References Cited

U.S. PATENT DOCUMENTS

| 3,662,454 | 5/1972 | Miller | 228/111 |
| 3,670,394 | 6/1972 | Daniels et al. | 228/110 |
| 4,023,725 | 5/1977 | Ivett et al. | 228/123 |
| 4,057,825 | 11/1977 | Narita et al. | 357/81 |
| 4,142,662 | 3/1979 | Holbrook et al. | 228/110 |
| 4,360,142 | 11/1982 | Carpenter et al. | 228/123 |
| 4,417,267 | 11/1983 | Wada et al. | 357/81 |

FOREIGN PATENT DOCUMENTS

| 2109865 | 3/1971 | Fed. Rep. of Germany | 228/110 |
| 51-6059 | 2/1976 | Japan . | |
| 0038885 | 3/1977 | Japan | 357/81 |
| 1440545 | 6/1976 | United Kingdom | 228/123 |
| 2067117 | 7/1981 | United Kingdom | 228/123 |

*Primary Examiner*—James W. Davie
*Assistant Examiner*—Frank Gonzalez
*Attorney, Agent, or Firm*—Wenderoth, Lind & Ponack

[57] ABSTRACT

A device for cooling semiconductor elements is constituted by a plate for cooling semiconductor elements, the plate being made of aluminum or an aluminum alloy, and a semiconductor element-mounting sheet which is made of aluminum or an aluminum alloy, the sheet having on one surface thereof a metal layer to which solder can be applied as desired, and the other surface of the sheet being secured by ultrasonic welding to the plate in a recessed portion formed in the cooling plate by ultrasonic welding.

6 Claims, 9 Drawing Figures

_page number_ 4,546,409

DEVICE FOR COOLING SEMICONDUCTOR ELEMENTS

BACKGROUND OF THE INVENTION

The present invention relates to a device for cooling semiconductor elements, and more specifically to improvements in a cooling member made of aluminum or an aluminum alloy which is used for cooling semiconductor elements.

A conventional device consists of a semiconductor element having a heat-conductive part made of copper, and a cooling member made of aluminum, wherein a copper layer is formed on the cooling member by plating copper or by depositing copper, and the copper layer is joined to the heat-conductive part.

With the above-mentioned conventional device for cooling semiconductor elements, however, the copper layer is formed by locally plating or locally depositing copper on the cooling member of aluminum, requiring increased cost and not being suited for being mass-produced.

SUMMARY OF THE INVENTION

The present invention seeks to eliminate the above-mentioned defects, and has for its object to provide an excellent device for cooling semiconductor elements.

BRIEF DESCRIPTION OF THE DRAWINGS

In the drawings, the same reference numerals denote the same or corresponding portions.

DESCRIPTION OF THE PREFERRED EMBODIMENTS

Figure 1:
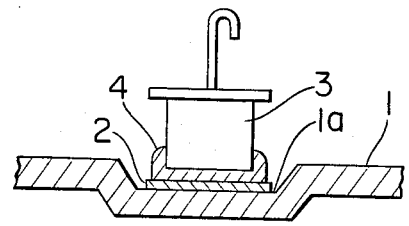
FIG. 1 is a front view illustrating partly in cross section a device for cooling a semiconductor element according to an embodiment of the present invention.
Figure 2:
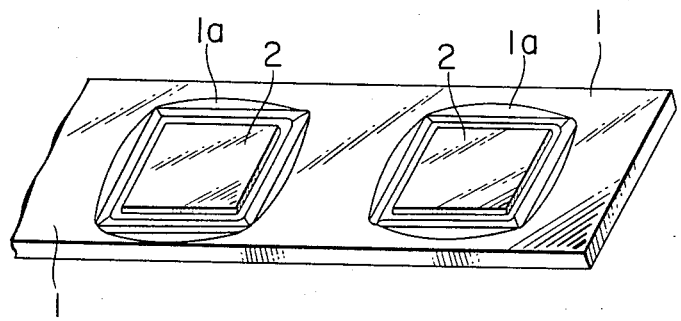
FIG. 2 is a perspective view of a cooling plate used for the embodiment of FIG. 1.
Figure 3:
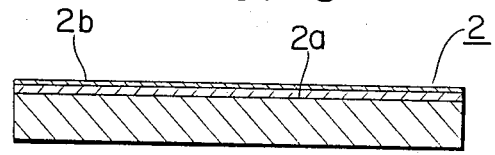
FIG. 3 is a cross section of a plate for mounting semiconductor elements used for the embodiment of FIG. 1.
Figure 4:
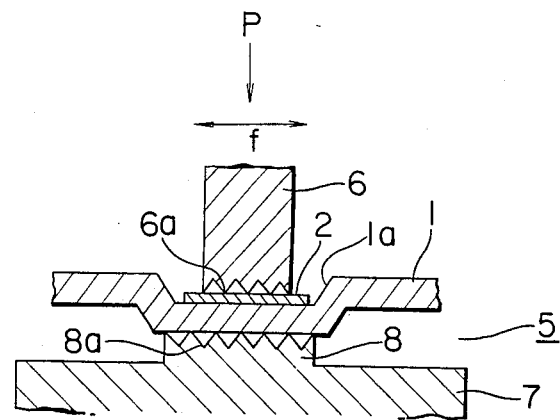
FIG. 4 is a diagram showing a step in the manufacturing process in which the device for cooling a semiconductor element of the embodiment of FIG. 1 is placed on an ultrasonic wave welder.
Figure 5:
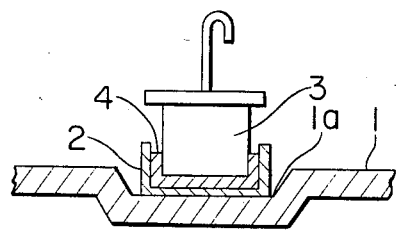
FIG. 5 is a front view showing partly in cross section a device for cooling a semiconductor element according to another embodiment according to the present invention.
Figure 6:
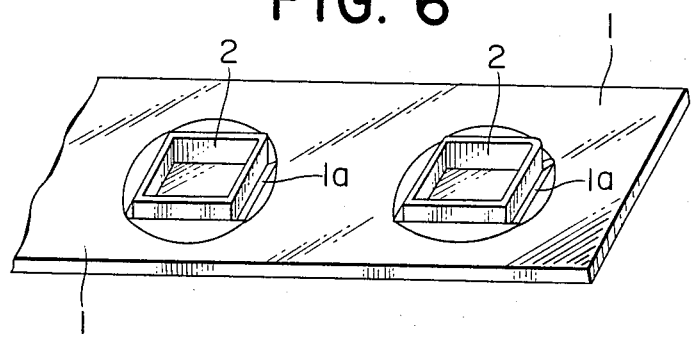
FIG. 6 is a perspective view of a cooling plate used for the embodiment of FIG. 5.
Figure 7:
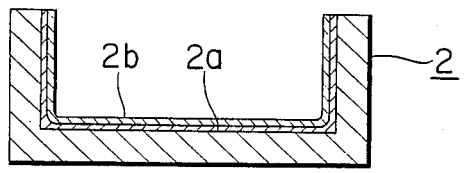
FIG. 7 is a cross section of a case for mounting semiconductor elements used for the embodiment of FIG. 5.
Figure 8:
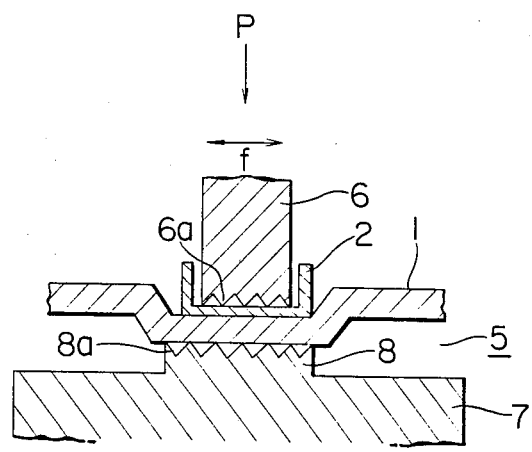
FIG. 8 is a diagram showing a step in the manufacturing process in which the device for cooling semiconductor elements of the embodiment of FIG. 5 is placed on an ultrasonic wave welder.

FIGS. 1 to 4 illustrate an embodiment of the present invention, in which reference numeral 1 denotes a cooling plate made of aluminum which is formed in the shape of a strap and which has mounting recesses 1a at a plurality of places, numeral 2 denotes semiconductor element-mounting sheets which are each secured in the mounting recesses 1a in the cooling plate by ultrasonic welding. The sheet 2 consists of an aluminum plate 2c having a copper layer 2a formed on one surface thereof by copperizing or the like, and further having a preformed solder layer 2b applied onto the outer side of the copper layer 2a. Reference numeral 3 denotes a diode which works as a semiconductor element and which is soldered as denoted by 4 onto the semiconductor element-mounting sheet 2, numeral 5 denotes an ultrasonic welder, and numeral 6 denotes a tip which is subjected to ultrasonic vibration from an ultrasonic vibration source (not shown). Projections 6a having a square pyramidal shape are formed on the end surface of the tip 6. The direction of ultrasonic vibration is as indicated by the arrow f, and a pressing force is exerted as indicated by the arrow p. Reference numeral 7 denotes a fixed support member made of a die steel which is provided opposite to the tip 6. An anvil 8 is formed on an upper end portion of the support member 7 as a unitary structure, and projections 8a having a square pyramidal shape are formed on the end surface of the anvil 8.

The manufacturing procedure for the above-described embodiment will be described herebelow.

First, mounting recesses 1a are formed in the cooling plate 1. A solder layer 2b is preformed on the copper layer 2a which in turn is formed on only one surface of the aluminum plate 2. The plate is then cut into semiconductor element-mounting sheets 2 of a size suited for being fitted into the mounting recesses 1a.

The semiconductor element-mounting sheet 2 is placed in the recess 1a in the cooling plate 1 in such a manner that the respective aluminum plates are against each other. The cooling plate 1 is then placed on the surface of anvil 8 of the ultrasonic wave welder, and the tip 6 is placed on the semiconductor element-mounting sheet 2. The tip 6 is moved in the direction of the arrow p to press the sheet 2 and the plate 1 against the anvil 8 with a predetermined force (150 kg), so that projections 6a and 8a of the tip 6 and anvil 8 bite into surfaces of the sheet 2 and the plate 1 opposite to the junction surfaces, respectively. With the junction portions of the sheet 2 and the cooling plate 1 being pressed by the tip 6 and the anvil 8, ultrasonic vibration is applied to the tip 6 to vibrate the chip 6 in the direction of arrow f, such that the junction surfaces of the sheet 2 and the cooling plate 1 are caused to rub against each other. Thus, the two members are joined together at the junction portions thereof. Then, the diode 3 is secured onto the semiconductor element-mounting sheet 2 by soldering 4.

According to the embodiment of the invention as described above, the cooling plate 1 and the semiconductor element-mounting sheet 2 are fastened together by the ultrasonic welding. Compared with the conventional device in which the copper layer 2a is formed in the recesses 1a of the cooling plate 1 by the copperizing, thereof, the device of the present invention can be mass-produced very easily in an automated manner.

Further, since the solder layer 2b has been preformed on the semiconductor element-mounting sheet 2, the surface of the copper layer 2a is not hardened when it is processed; i.e., the surface does not become like it does when it is annealed. Therefore, the copper layer 2a is not destroyed during the step of the ultrasonic welding operation.

In the above-described embodiment, aluminum was used for the cooling plate 1 and the plate 2c of the semiconductor element-mounting sheet 2. Instead of aluminum, however, an aluminum alloy may be employed.

Further, although the semiconductor element-mounting sheet 2 was coated with a copper layer 2a, it may be coated with any other metal such as nickel or tin to which soldering can be applied effectively. Moreover, although the copper layer 2a and the solder layer 2b were applied onto only one surface of the aluminum plate 2c of the semiconductor element-mounting sheet 2 in the above-mentioned embodiment, the invention should in no way be limited thereto.

FIGS. 5 to 8 illustrate another embodiment in which a cup-shaped semiconductor element-mounting case 2 is provided in the mounting recess 1a of the cooling plate 1. The case 2 consists of an aluminum plate having on one surface thereof formed a copper layer 2a by copperizing. Further, a pre-formed solder layer 2b is formed on the outer side of the copper layer. Reference numeral 3 denotes a diode which is a semiconductor element and which is secured by soldering 4 onto the semiconductor element-mounting case 2, numeral 5 denotes an ultrasonic wave welder, and numeral 6 denotes a tip which receives ultrasonic vibration from an ultrasonic vibration generating source (not shown). Projections 6a having a square pyramidal shape are formed on the end surface of the tip 6. The direction of ultrasonic vibration is as indicated by arrow f, and a pressing force is exerted in the direction of arrow p. Reference numeral 7 denotes a fixed support member made of a die steel which is provided opposite to the tip 6. An anvil 8 is formed on an upper end portion of the support member 7 as a unitary structure, and projections 8a having a square pyramidal shape are formed on the end surface of the anvil 8.

The manufacturing procedure of the above-described embodiment will be described herebelow.

First, mounting recesses 1a are formed in the cooling plate 1. A solder layer 2b is preformed on the copper layer 2a which is formed on one surface of the aluminum plate 2. The plate is then cut into semiconductor element-mounting cases 2 of a size suited for being fitted in the mounting recesses 1a.

The semiconductor element-mounting case 2 is placed in the recess 1a in the cooling plate 1 in such a manner that their respective aluminum plates are touching each other. The cooling plate 1 is then placed on the surface of the anvil 8 of the ultrasonic wave welder, and the tip 6 is placed on the semiconductor element-mounting case 2. The tip 6 is moved in the direction of the arrow p to press the case 2 and the cooling plate 1 against the anvil 8 with a predetermined force (150 kg), so that projections 6a and 8a of the tip 6 and anvil 8 bite into surfaces of the case 2 and the cooling plate 1 opposite to the junction surfaces, respectively. With the junction portions of the case 2 and the cooling plate 1 being pressed by the tip 6 and the anvil 8, ultrasonic vibration is applied to the tip 6 to vibrate the chip 6 in the direction of the arrow f, such that the junction surfaces of the case 2 and the cooling plate 1 are caused to rub against each other. Thus, the two members are joined together at the junction portions thereof. Then, the diode 3 is secured onto the semiconductor element-mounting case 2 by soldering 4.

In the above-described embodiment in which the case 2 is formed in the shape of a cup, the solder 4 does not flow out of the case when the diode 3 is soldered onto the case. Therefore, the solder 4 does not adhere onto the cooling plate 1, and the surface of the plate 1 is not corroded.

Figure 9:
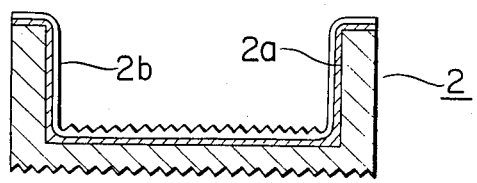
FIG. 9 is a cross section of a case for mounting semiconductor elements according to a further embodiment.

FIG. 9 shows a further embodiment in which the bottom portion of the cup-shaped case 2 has roughened upper and lower surfaces. That is, since the case 2 has the shape of a cup, the solder 4 does not flow out when the semiconductor element 3 is soldered onto the case 2. Moreover, since the bottom portion of the cup-shaped case 2 has roughened upper and lower surfaces, rattling does not develop between the case 2 and the plate 1 when they are subjected to the ultrasonic wave welding. Further, positions of the tip 6, case 2 and plate 1 are not shifted relative to one another, and the two members can be reliably welded together.

What is claimed is:

1. A device for cooling semiconductor elements, comprising:
    a cooling plate for cooling semiconductor elements, said plate being made of an aluminum material taken from the group consisting of aluminum and aluminum alloy and having recessed portions therein; and
    a preformed semiconductor element-mounting sheet which is made of an aluminum material taken from the group consisting of aluminum and aluminum alloy, said sheet having on one surface thereof a metal layer other than the metal of said mounting sheet and to which solder is readily bondable, and the other surface of said sheet being ultrasonically welded in an aluminum material to aluminum material bond to the aluminum material of said mounting sheet in a recessed portion of said cooling plate.

2. A device for cooling semiconductor elements as claimed in claim 1 wherein said metal layer is copper.

3. A device for cooling semiconductor elements as claimed in claim 1, further comprising a solder layer on the outer surface of said metal layer.

4. A device for cooling semiconductor elements as claimed in claim 1 wherein said semiconductor element-mounting sheet is in the shape of a cup opening out of the recess.

5. A device for cooling semiconductor elements as claimed in claim 1 wherein at least one of said mounting sheet and said cooling plate has a roughened surface thereon for reinforcing the mounting.

6. A combined semiconductor element and a cooling device therefor, comprising:
    a cooling plate for cooling semiconductor elements, said plate being made of an aluminum material taken from the group consisting of aluminum and aluminum alloy and having recessed portions therein; and
    a preformed semiconductor element-mounting sheet which is made of an aluminum material taken from the group consisting of aluminum and aluminum alloy, said sheet having on one surface thereof a metal layer other than the metal of said mounting sheet and a preformed solder layer on the outer surface of said metal layer, and the other surface of said sheet being ultrasonically welded in an aluminum material to aluminum material bond to the aluminum material of said mounting sheet in a recessed portion of said cooling plate; and
    a semiconductor element soldered to said mounting sheet by said solder layer.

* * * * *